United States Patent [19]

Iwasaki

[11] Patent Number: 5,710,458
[45] Date of Patent: Jan. 20, 1998

[54] CARD LIKE SEMICONDUCTOR DEVICE

[75] Inventor: Hiroshi Iwasaki, Kanagawa, Japan

[73] Assignee: Kabushiki Kaisha Toshiba, Kanagawa-ken, Japan

[21] Appl. No.: 554,104

[22] Filed: Nov. 6, 1995

Related U.S. Application Data

[63] Continuation of Ser. No. 294,354, Aug. 23, 1994, abandoned.

[30] Foreign Application Priority Data

Dec. 20, 1993 [JP] Japan ............... 5-320243

[51] Int. Cl.$^6$ ............... H01Q 11/12; H01L 23/48
[52] U.S. Cl. ............... 257/679; 257/778; 340/572; 235/491; 343/867
[58] Field of Search ............... 340/572; 343/741–744, 343/787, 788, 702, 872, 873, 867; 257/679, 728, 531, 778; 235/491, 492

[56] References Cited

U.S. PATENT DOCUMENTS

| | | | |
|---|---|---|---|
| 4,857,893 | 8/1989 | Carroll | 340/572 |
| 4,939,792 | 7/1990 | Urbish et al. | 343/702 |
| 4,961,105 | 10/1990 | Yamamoto | 257/679 |
| 4,999,699 | 3/1991 | Christie et al. | 257/793 |
| 5,232,532 | 8/1993 | Hori | 156/163 |
| 5,337,063 | 8/1994 | Takahira | 343/741 |

FOREIGN PATENT DOCUMENTS

| | | | |
|---|---|---|---|
| 0179891 | 9/1985 | Japan | 235/492 |
| 0201179 | 9/1986 | Japan | 340/572 |
| 0246292 | 10/1988 | Japan . | |
| 0016831 | 3/1992 | Japan . | |
| 9217866 | 10/1992 | WIPO | 340/572 |

OTHER PUBLICATIONS

Translation of Japan Kokai Publ. #60–0179891 (Sep. 13, 1985) to Arimura, 14 pages.

*Primary Examiner*—Peter Toby Brown
*Attorney, Agent, or Firm*—Finnegan, Henderson, Farabow, Garrett & Dunner, L.L.P.

[57] ABSTRACT

A semiconductor package has high reliability and a simple structure and configuration, can be removed as a function section performing the main data processing, substantially improves retainability and portability, and is connected to external equipment without the need of contact. The semiconductor package comprises a circuit board on one main side of which has a region in which IC chips can be mounted, ac IC chip mounted in said region on the surface of the circuit board, a shield resin layer that buries or covers at least part of the mounted IC chip, at least one loop-like antenna pattern integrally formed in a region of the main side other than the region in which the IC chip is mounted for transmitting and receiving signals without the need of contact, and an antenna pattern for power induction located independently of said antenna pattern and inducing power electromagnetically. According to this semiconductor package, the antenna pattern for transmission and reception is also used to cause electromagnetic induction, and the induced power is used to drive the IC chip. This allows drive power batteries or external power connection terminals to be omitted, thereby substantially simplifying the handling of this package. Since this also obviates the need of the space for installing these power batteries and external power connection terminals, the package can be more compact.

5 Claims, 2 Drawing Sheets

CARD LIKE SEMICONDUCTOR DEVICE

This application is a continuation of application Ser. No. 08/294,354 filed Aug. 23, 1994, now abandoned.

BACKGROUND OF THE INVENTION

1. Field of the Invention

The present invention relates to a thin semiconductor package suitable for configuring a portable electronic device such as an IC card and, in particular, the present invention relates to a semiconductor package connected to external equipment without contact.

2. Description of the Related Art

Various memory cards are known as storage devices capable of recording and storing various data. Such storage devices include microcomputer cards with built-in CPU's and non-contact radio cards and have different features and advantages in practical use. Contact microcomputer cards an non-contact radio cards are thus used for different purposes depending on their particular features and advantages.

Complex IC cards with the features and advantages of both contact and non-contact IC cards have been developed to overcome the inconvenience of cards having the features and advantages of either contact or non-contact cards only, [for example, Japanese Patent Publication No. HEI 4 (1992) -16,831]. However, there are limitation regarding the size and thickness of IC cards. For example, there is demand for semiconductor chips (IC elements) for providing memory functions to be made thinner, and for packages to be made as thin and compact as possible.

For semiconductor packages, however, electrode terminals for external connections (terminal pads or lead pins) protrude from the surface of, for example, a circuit card on which semiconductor chips are mounted. Consequently, this part of the package cannot be made smaller, thus limiting efforts to make the package more compact. In addition, the exposed parts of electrode terminals can easily become contaminated or damaged by oxidation or adhesion of fats and oils, or broken under external mechanical force. Thus, the packages may fail to provide or maintain reliable electrical connections, and may not be well suited for practical use.

It is therefore an object of this invention to provide a reliable semiconductor package capable of transmitting and receiving signals without the need of contact.

It is another object of this invention to provide a thin and compact semiconductor package with a simple structure and configuration which can transmit and receive signals without the need of contact.

It is yet another object of this invention to provide a semiconductor package including a function section that performs the main data processing in non-contact data transmission and reception.

It is a further object of this invention to provide a semiconductor package that substantially improves the retainability and portability of IC cards.

SUMMARY OF THE INVENTION

A semiconductor package in accordance with this invention comprises a circuit board having a region to mount an IC chip on a main side thereof, an IC chip mounted in said region of the circuit board, a shield resin layer burying or covering at least part of said mounted IC chip, and a first loop-like antenna pattern, formed integrally in a region on the main side of the circuit board other than the region in which said IC chip is mounted, for transmitting and receiving a signal without the need of contact.

This invention is a semiconductor package with an antenna function for transmitting and receiving signals in a non-contact manner, and is characterized by the use of power induced electromagnetically through the loop-like antenna as drive power to the IC chip. That is, this invention focuses on the fact that sufficient electromagnetically induced power and signal intensity can be produced when the antenna of external equipment is near. If the signal frequency is within the microwave region, the loop-like antenna pattern can be smaller. In addition, if a plurality of loop-like antennas is provided, one used for signal transmission and another for the electromagnetic induction of drive power to the IC chip, signal processing and power induction can be carried out simultaneously, resulting in faster signal processing.

DESCRIPTION OF THE PREFERRED EMBODIMENTS

Figure 1:
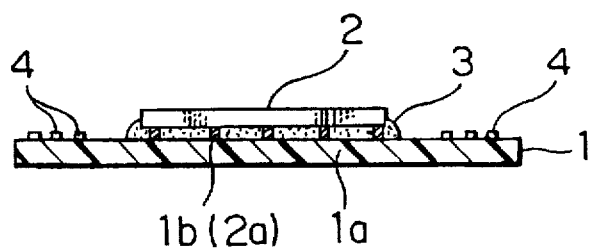
FIG. 1 is a cross sectional view showing an example of a configuration of a semiconductor package in accordance with this invention.

The semiconductor package in accordance with this invention is a portable device such as an IC card, and can be removed or replaced easily as a function section performing the main data processing. FIG. 1 shows a cross section of an example of a configuration of the important part of the semiconductor package, wherein at least part of an IC chip 2 mounted on one main side of a circuit board 1 is buried in or covered with a shield resin layer 3. This semiconductor package is also characterized by at least one loop-like antenna 4 located in a region of the circuit board 1 other than the region in which the IC chip 2 is mounted, the antenna 4 transmitting and receiving signals without the need of contact. In this configuration, the loop-like antenna 4 acts as a drive power source for the IC chip 4 and also transmits and receives data signals. This obviates the need of external connection terminals to prevent the IC chip 2 from being damaged by electrostatic connections due to the damaged or contaminated exposed surface of terminals, and improves the reliability of signal writes and reads.

In this invention, the circuit board includes those using as an insulator a synthetic resin such as an epoxy resin or ceramics such as alumina. The circuit board may be single-sided, double-sided, or multilayer-interconnected, but preferably has a thickness of about 0.2 mm to 1 mm, and a side length of 20 mm to 80 mm, so as to be thin and compact. On the other hand, a plurality of IC chips can be mounted on the circuit board depending on their functions, but those with high functions and capacity are desirably selected to simplify the configuration. The resin for burying or covering at least part of the semiconductor chip is, for example, an epoxy resin, and the burying or covering is carried out by a coating method or a molding method.

This invention is described specifically with reference to FIGS. 2 through 5.

Figure 2:
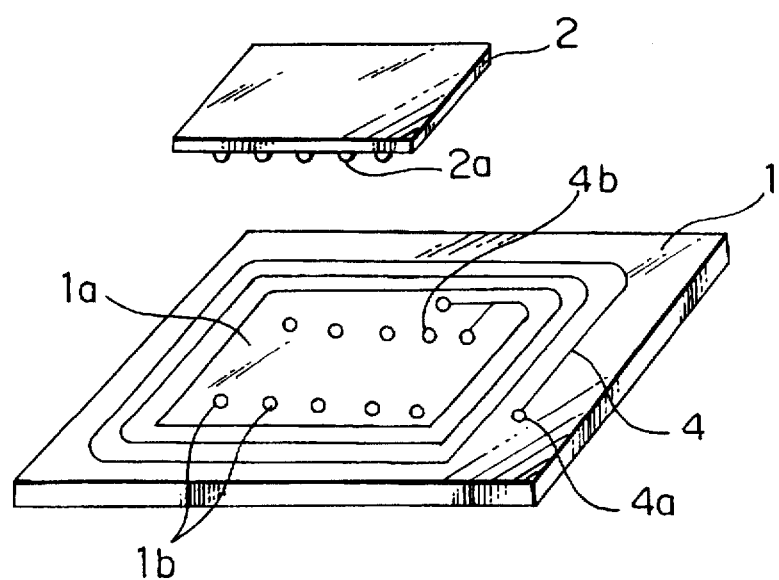
FIG. 2 is a perspective view showing an example of a configuration of a semiconductor package in accordance with this invention when disassembled.
Figure 3:
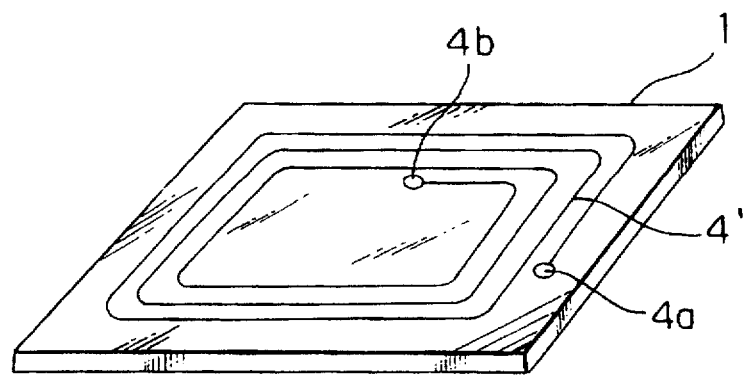
FIG. 3 is a perspective view showing the configuration of the rear side of the circuit board illustrated in FIG. 2.

FIG. 2 is a schematic perspective view of an example of a configuration of the semiconductor package in accordance with this invention when disassembled. FIG. 3 is a perspective view of the rear side of the circuit board illustrated in FIG. 2. Reference numeral 1 is a circuit board including a region 1a in which the IC chip 2 is mounted. For example, it is made of resin and has a thickness of 0.4 mm and side length of 30 mm. Reference numeral 2 is an IC chip mounted by face down bonding in the region 1a of the circuit board 1, and, for example, has a side length of about 10 mm. Reference numeral 4 is a loop-like antenna pattern with a width of about 0.3 mm which is disposed integrally by a selective metal vapor disposition means or selective deposited-film lithography means in a region of the circuit board 1 other than the region 1a in which the IC chip 2 is mounted. The loop antenna pattern 4 in connected serially via through holes 4a, 4b to a loop antenna pattern 4' disposed integrally on the rear side of the circuit board 1 to form a single antenna pattern. The IC chip 2 has its connection bump 2a connected to the corresponding connection bump 1b of the circuit board 1 in the region of the circuit board 1 in which the IC chip is mounted, thereby constituting a semiconductor main body.

In this invention, the semiconductor package is shielded with a resin. That is, at least the region in which the IC chip 2 is mounted is processed or molded with, for example, a thermoplastic resin to form a shield resin layer for burying or covering at least part of the IC chip 2, thereby providing the configuration desired as a semiconductor package.

Figure 4:
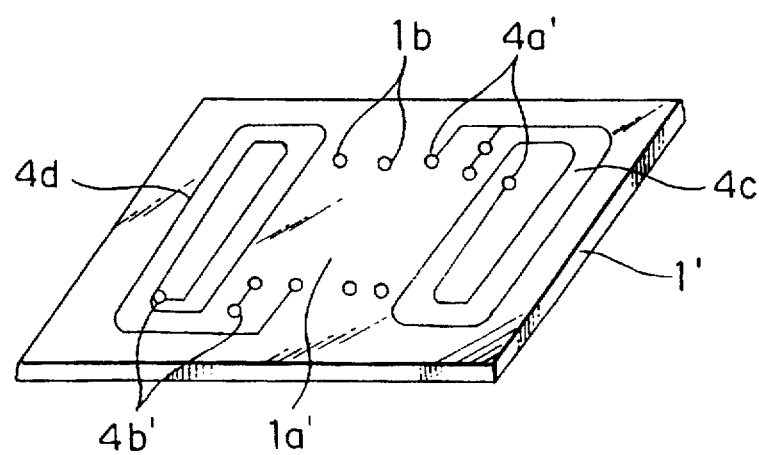
FIG. 4 is a perspective view showing an example of another configuration of a circuit board in a semiconductor package in accordance with this invention.
Figure 5:
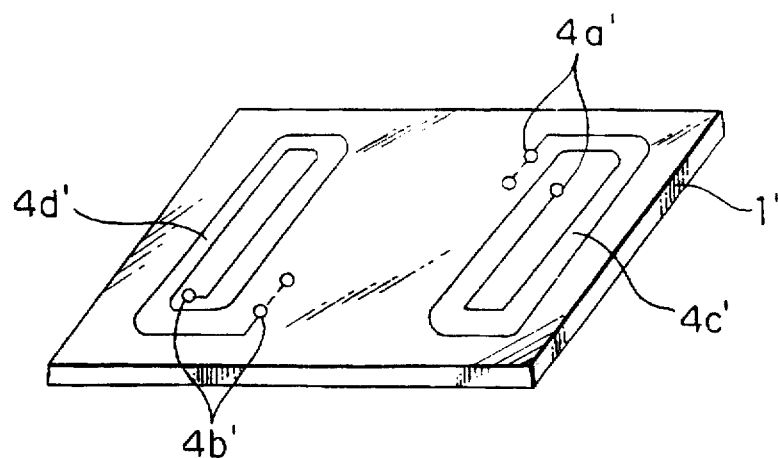
FIG. 5 is a perspective view showing the configuration of the rear side of the circuit board illustrated in FIG. 4.

In the above configuration, use of a multilayer-interconnected circuit board reduces the size of the circuit board 1 (the area of the circuit board), resulting in a more compact semiconductor package. In addition, if the antenna patterns are located on a plurality of interconnected layers and connected serially to each other, the inductance increases to improve the reception sensitivity. On the other hand, if a sufficient reception sensitivity is provided, the loop-like antenna pattern 4' integrally disposed on the rear side of the circuit board 1 as shown in FIG. 3 can be omitted, and the antenna pattern may only be disposed on the side on which the IC chip 2 is mounted. In this case, the circuit board 1 has a simple single-sided configuration and requires much lower costs. With this example of configuration, the required functions of a semiconductor package were provided when a frequency with a wave length differing from that of the signal frequency was applied externally to the loop-like antenna patterns 4, 4' (or the loop-like antenna pattern 4 only) with a proper timing to electromagnetically induce power, which is then used as a drive source for the IC chip 1. Another specific example is demonstrated in that the semiconductor package in the perspective view shown in FIGS. 4 and 5 is similar to the above example except that it uses a circuit board 1' with two loop-like antenna patterns 4c, 4c' and 4d, 4d' formed integrally in a manner similar to that of the above example. That is, on that side of the circuit board 1' which includes the region 1a' in which the semiconductor chip 2 is mounted, mutually independent loop-like antenna patterns 4c, 4d are integrally formed with the region 1a' interposed, as shown in the perspective view in FIG. 4. If required for reception sensitivity, it is possible to use a circuit board 1' with loop-like antenna patterns 4c', 4d' connected serially to the loop-like antenna patterns 4c, 4d via through holes 4a, 4b formed integrally on the rear side of the circuit board 1' with the independently and serially connected pairs of loop-like antenna patterns 4c—4c', 4d—4d' formed independently (isolatively) on both sides and shielding the semiconductor chip 2 with a resin layer 3.

For the semiconductor package with this configuration, the reception sensitivity must be somewhat sacrificed because the semiconductor chip 2 is mounted between the mutually independent loop-like patterns 4c, 4d. However, using the independent loop-like antenna patterns 4c, 4c' and 4d, 4d' separately for electromagnetic induction and signal transmission allows signals to be processed quickly and the semiconductor package to be compact.

A multilayer circuit board and serially connected antenna patterns located on a plurality of wiring layers may also be used to improve the reception sensitivity, as in the above example.

This invention is not limited to the above specific examples but may be subjected to various modifications unless they deviate from the spirit of this invention. For example, the semiconductor chip (IC chip) can be mounted by means of a wire bonding method instead of the above face down bonding method.

As is apparent from the above description, in the semiconductor package in accordance with this invention, the built-in IC chip is driven by the power induced electromagnetically by the antenna pattern performing reception. That is, the antenna pattern for transmission and reception is also used to cause electromagnetic induction, and the induced power is used to drive the IC chip. This allows drive power batteries or external power connection terminals to be omitted, thereby substantially simplifying the handling of this package. Since this also obviates the need of the space for installing these power batteries and external power connection terminals, the package can be more compact.

What is claimed is:

1. A card like semiconductor device comprising:

a circuit board having a chip region on a main side thereof, said circuit board also including an antenna region separated from said chip region an IC chip mounted along said chip region of said circuit board, said IC chip having at least one bump contact extending therefrom for electrically connecting said IC chip to said circuit board along said main side;

a protective resin layer substantially encapsulating said at least one bump contact;

a first loop-like antenna pattern for transmitting and receiving a signal, said first loop-like antenna pattern being formed integrally along said antenna region of said circuit board and being spaced from said IC chip for driving said IC chip by inducing power electromagnetically; and a second loop-like antenna pattern formed on a rear side of said circuit board, said second loop-like antenna pattern being serially connected to said first loop-like antenna pattern.

2. A semiconductor device comprising:

a circuit board having a chip region on a main side there of, said circuit board also including an antenna region separate from said chip region;

an IC chip mounted along said chip region of said circuit board, said IC chip having at least one bump contact extending therefrom for electrically connecting said IC chip to said circuit board along said main side;

a protective resin layer substantially encapsulating said at least one bump;

a first loop-like antenna pattern for transmitting and receiving a signal, said first loop-like antenna pattern being formed integrally along said antenna region of said circuit board and being spaced from said IC chip for driving said IC chip by induction; and a second loop-like antenna pattern formed on a rear side of said circuit board, said second loop-like antenna pattern being serially connected to said first loop-like antenna pattern.

3. A card like semiconductor device, comprising:

a circuit board having a chip region on a main side thereof, said circuit board also having a rear side opposite said main side;

an IC chip mounted along said chip region of said circuit board, said IC chip having at least one bump contact extending therefrom for electrically connecting said IC chip to said circuit board along said main side;

a protective resin layer substantially encapsulating said at least one bump contact;

a first loop-like antenna pattern spaced from said IC chip on said main side; and a second loop-like antenna pattern, formed integrally on a rear side of said circuit board, said second loop-like antenna pattern being serially connected via through holes to said first loop-like antenna pattern to form a single antenna pattern for transmitting and receiving a signal without contacting an external source of power and for inducing power electromagnetically.

4. The semiconductor device according to claim 3, wherein the IC chip is mounted in a face-down relation along said chip region on said main side of said circuit board.

5. A card like semiconductor device comprising:

a circuit board having at least one two interconnected surfaces, wherein one of said at least two interconnected surfaces is a main surface;

an IC chip mounted along said surface of said circuit board, said IC chip having at least one bump contact for electrically connecting said IC chip to said circuit board along said main surface;

a protective resin layer substantially encapsulating said at least one bump contact;

a first loop-like antenna pattern formed integrally on said main surface, said first loop-like antenna pattern being spaced from said IC chip; and a second loop-like antenna pattern formed on one of said at least two interconnected surfaces, said first and second antenna patterns driving said IC chip by inducing power electromagnetically, wherein said at least two interconnecting surfaces include a rear surface, the semiconductor device further comprising:

a third loop-like antenna pattern formed on said rear surface of said circuit board and connected to said first loop-like antenna pattern via through holes; and a fourth loop-like antenna pattern formed on said rear surface of said circuit board and connected to said second loop-like antenna pattern.

\* \* \* \* \*